(12) United States Patent
Byun et al.

(10) Patent No.: US 11,276,528 B2
(45) Date of Patent: Mar. 15, 2022

(54) ELECTRONIC COMPONENT

(71) Applicant: SAMSUNG ELECTRO-MECHANICS CO., LTD., Suwon-si (KR)

(72) Inventors: Man Su Byun, Suwon-si (KR); Ho Yoon Kim, Suwon-si (KR); Soo Hwan Son, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 49 days.

(21) Appl. No.: 16/849,681

(22) Filed: Apr. 15, 2020

(65) Prior Publication Data
US 2021/0175019 A1 Jun. 10, 2021

(30) Foreign Application Priority Data
Dec. 9, 2019 (KR) .................. 10-2019-0162558

(51) Int. Cl.
*H01G 2/02* (2006.01)
*H01G 4/012* (2006.01)
(Continued)

(52) U.S. Cl.
CPC ............... *H01G 4/30* (2013.01); *H01G 2/02* (2013.01); *H01G 4/012* (2013.01); *H01G 4/1218* (2013.01); *H01G 4/2325* (2013.01)

(58) Field of Classification Search
CPC ............ H01G 2/02; H01G 2/06; H01G 2/065; H01G 4/012; H01G 4/1218; H01G 4/232;
(Continued)

(56) References Cited

U.S. PATENT DOCUMENTS

2012/0134066 A1 5/2012 Kim et al.
2013/0319741 A1 12/2013 Ahn et al.
(Continued)

FOREIGN PATENT DOCUMENTS

JP 2005-191206 A 7/2005
JP 5472230 B2 4/2014
(Continued)

OTHER PUBLICATIONS

Korean Office Action dated Oct. 20, 2020 issued in Korean Patent Application No. 10-2019-0162558 (with English translation).

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

An electronic component includes a multilayer capacitor, including a capacitor body and first and second external electrodes disposed on both ends of the capacitor body, respectively, in a first direction, and a interposer including an interposer body and first and second external terminals in a second direction. The capacitor body includes a plurality of dielectric layers and a plurality of first and second internal electrodes exposed through the both ends of the capacitor body, respectively. The first and second external terminals each include a first layer including CuNi, a second layer covering the first layer and including copper (Cu), a third layer covering the second layer and including nickel (Ni), and a fourth layer covering the third layer and including tin (Sn), which are sequentially disposed from a respective inner side of the first and second external terminals.

19 Claims, 6 Drawing Sheets

(51) Int. Cl.
*H01G 4/12* (2006.01)
*H01G 4/232* (2006.01)
*H01G 4/30* (2006.01)

(58) Field of Classification Search
CPC .......... H01G 4/2325; H01G 4/30; H01G 4/12;
H01G 4/40; H05K 1/0271; H05K 1/181;
H05K 2201/10015; H05K 2201/10378;
H05K 2201/2045
USPC ......... 361/306.3, 321.4, 301.4, 321.2, 321.5;
174/260
See application file for complete search history.

(56) References Cited

U.S. PATENT DOCUMENTS

| | | | |
|---|---|---|---|
| 2014/0333855 A1 | 11/2014 | Park et al. | |
| 2018/0108483 A1* | 4/2018 | Sasabayashi | H01G 4/1209 |
| 2018/0158608 A1* | 6/2018 | Fujita | H01G 4/224 |
| 2018/0254255 A1* | 9/2018 | Orikasa | H01L 24/81 |
| 2019/0096577 A1* | 3/2019 | Uenishi | H01G 4/005 |
| 2020/0058443 A1 | 2/2020 | Kang et al. | |
| 2020/0118744 A1 | 4/2020 | Sim et al. | |

FOREIGN PATENT DOCUMENTS

| | | | |
|---|---|---|---|
| KR | 10-2012-0056549 A | 6/2012 | |
| KR | 10-1309479 B1 | 9/2013 | |
| KR | 10-2014-0133401 A | 11/2014 | |
| KR | 20170118637 A * | 10/2017 | ............ H01G 2/065 |
| KR | 10-1994747 B1 | 7/2019 | |
| KR | 10-2019-0121148 A | 10/2019 | |
| KR | 10-2019-0121206 A | 10/2019 | |

\* cited by examiner

ELECTRONIC COMPONENT

CROSS-REFERENCE TO RELATED APPLICATION(S)

The present application claims the benefit of priority to Korean Patent Application No. 10-2019-0162558 filed on Dec. 9, 2019 in the Korean Intellectual Property Office, the entire disclosure of which is incorporated herein by reference.

BACKGROUND

1. Field

The present disclosure relates to an electronic component.

2. Description of Related Art

Multilayer capacitors are widely used as components of various electronic devices due to the small size, high capacity, and ease of mounting thereof.

Multilayer capacitors (MLCCs) have a structure in which internal electrodes having different polarities are alternately disposed between a plurality of dielectric layers, to have the dielectric layer interposed therebetween.

In this case, since the dielectric layer has piezoelectric properties through using a ferroelectric material, a piezoelectric phenomenon occurs between internal electrodes when a direct current or alternating current is applied to the multilayer capacitor, thereby expanding and contracting the volume of a capacitor body depending on frequency and generating periodic vibrations.

Such vibrations may be transmitted to a substrate through a solder connecting an external electrode of the multilayer capacitor to the substrate when mounting thereof on the substrate is performed, and thus the entire substrate may become an acoustic reflection surface to generate vibration sound that may be experienced as noise.

The vibration sound may correspond to an audible frequency causing listener discomfort, and thus, the vibration sound causing listener discomfort is known as acoustic noise.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide an electronic component capable of improving bending strength and reducing acoustic noise.

According to an aspect of the present disclosure, an electronic component includes a multilayer capacitor including a capacitor body having first and second surfaces opposing each other in a first direction, third and fourth surfaces connected to the first and second surfaces and opposing each other in a second direction, and fifth and sixth surfaces connected to the first and second surfaces, connected to the third and fourth surfaces and opposing each other, the multilayer capacitor further including first and second external electrodes disposed on both ends of the capacitor body, respectively, in the second direction. The electronic component further includes a interposer disposed on a first surface side of the multilayer capacitor in the first direction, the interposer including an interposer body and first and second external terminals disposed on both ends of the interposer body in the second direction. The capacitor body includes a plurality of dielectric layers and a plurality of first and second internal electrodes alternately disposed in the first direction, with the respective dielectric layers interposed therebetween. The plurality of first and second internal electrodes are exposed through the third and fourth surfaces of the capacitor body, respectively. The first and second external terminals each include a first layer including CuNi, a second layer covering the first layer and including copper (Cu), a third layer covering the second layer and including nickel (Ni), and a fourth layer covering the third layer and including tin (Sn), which are sequentially disposed from a respective inner side of the first and second external terminals.

The second to fourth layers may be plating layers.

The first external terminal may include a first bonding portion disposed on the interposer body to be connected to the first external electrode, a first mounting portion disposed on the interposer body to face the first bonding portion in the first direction, and a first connection portion disposed on the interposer body to connect the first bonding portion and the first mounting portion. The second external terminal may include a second bonding portion disposed on the interposer body to be connected to the second external electrode, a second mounting portion disposed on the interposer body to face the second bonding portion in the first direction, and a second connection portion disposed on the interposer body to connect the second bonding portion and the second mounting portion.

Conductive adhesives are arranged between the first and second external electrodes and the first and second bonding portions, respectively.

The conductive adhesive may be solder.

The first and second external terminals each may have a 'U'-shaped cross section.

A thickness of the first bonding portion may be greater than a thickness of the first mounting portion in the first direction, and a thickness of the second bonding portion may be greater than a thickness of the second mounting portion in the first direction.

The thickness of the first bonding portion may be 20 to 40 µm greater than the thickness of the first mounting portion, and the thickness of the second bonding portion may be 20 to 40 µm greater than the thickness of the second mounting portion.

Thicknesses of the first and second bonding portions in the first direction may be 65 µm or more and less than 111 µm.

The interposer body may include alumina.

The first and second external electrodes may include first and second connection portions disposed on the third and fourth surfaces of the capacitor body, respectively, and first and second band portions extending from the first and second connection portions, respectively, to portions of the first surface of the capacitor body.

The first and second band portions may extend from the first and second connection portions, respectively, to portions of the second, fifth, and sixth surfaces of the capacitor body.

The electronic component may further include a plating layer disposed on surfaces of the first and second external electrodes.

According to an aspect of the present disclosure, an electronic component includes a multilayer capacitor including a capacitor body having first and second surfaces opposing each other in a first direction, third and fourth surfaces connected to the first and second surfaces and opposing each other in a second direction, and fifth and sixth surfaces connected to the first and second surfaces, connected to the third and fourth surfaces and opposing each other, the multilayer capacitor further including first and second external electrodes disposed on both ends of the capacitor body, respectively, in the second direction. The electronic component further includes a interposer disposed on a first surface side of the multilayer capacitor in the first direction, the interposer including an interposer body and first and second external terminals disposed on both ends of the interposer body in the second direction. The capacitor body includes a plurality of dielectric layers and a plurality of first and second internal electrodes alternately disposed in the first direction, with the respective dielectric layers interposed therebetween. The plurality of first and second internal electrodes are exposed through the third and fourth surfaces of the capacitor body, respectively. The first and second external terminals each include four distinctive layers including a first layer, a second layer covering the first layer, a third layer covering the second layer, and a fourth layer covering the third layer, which are sequentially disposed from a respective inner side of the first and second external terminals. The first to fourth layers of each of the first and second external terminals include materials different from each other.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
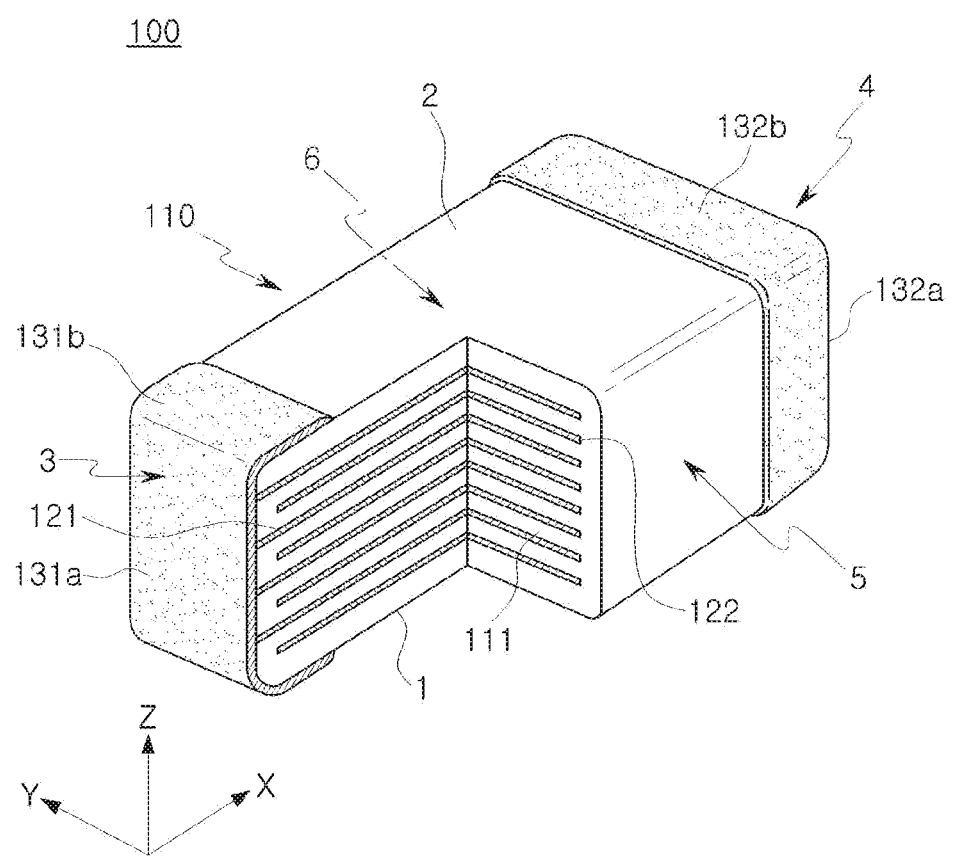
FIG. 1 is a partial cross-sectional perspective view illustrating a multilayer capacitor applied to an electronic component according to an exemplary embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or exemplary embodiment, e.g., as to what an example or exemplary embodiment may include or implement, means that at least one example or exemplary embodiment exists in which such a feature is included or implemented while all examples and exemplary embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

When the direction is defined to clearly describe the exemplary embodiments of the present disclosure, X, Y, and Z illustrated in the drawings indicate the length direction, the width direction, and the thickness direction of the multilayer capacitor and the interposer, respectively.

In the embodiment, the Z direction may be used in the same concept as the stacking direction in which the dielectric layers 111 are stacked.

Figure 2A:
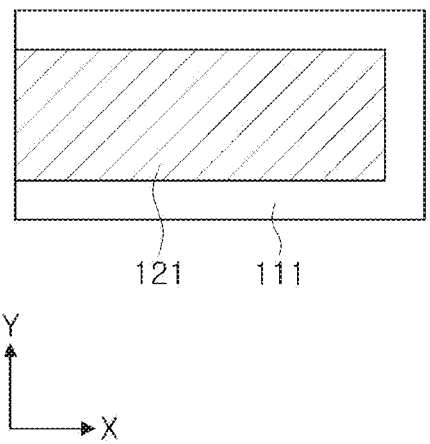
FIGS. 2A and 2B are plan views illustrating first and second internal electrodes of the multilayer capacitor of FIG. 1, respectively.
Figure 2B:
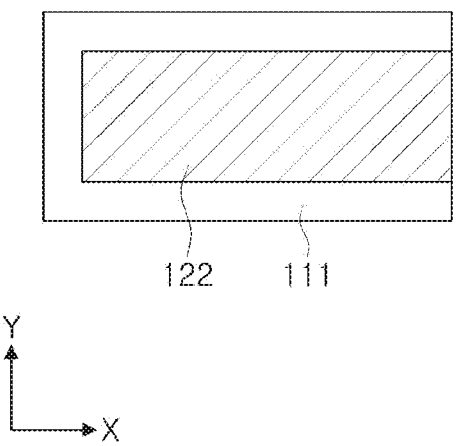

FIG. 1 is a partially cutaway perspective view of a multilayer capacitor applied to an electronic component according to an exemplary embodiment, and FIGS. 2A and 2B are plan views illustrating first and second internal electrodes of the multilayer capacitor of FIG. 1, respectively.

First, the structure of a multilayer capacitor 100 applied to an electronic component according to an exemplary embodiment will be described with reference to FIGS. 1 to 2B.

The multilayer capacitor 100 according to this embodiment includes a capacitor body 110 and first and second external electrodes 131 and 132 formed on both ends of the capacitor body 110 in the X direction, respectively.

The capacitor body 110 is obtained by stacking a plurality of dielectric layers 111 in the Y direction, being followed by firing, and the dielectric layers 111 of the capacitor body 110, adjacent to each other, may be integrated with each other to such an extent that the boundary therebetween is difficult to confirm without using a scanning electron microscope (SEM).

The capacitor body 110 includes a plurality of dielectric layers 111 and a plurality of first and second internal electrodes 121 and 122 having different polarities, which are alternately disposed in the Z direction with the dielectric layers 111 interposed therebetween.

The capacitor body 110 may include an active region that contributes to capacitance formation of the capacitor, and a cover region that is respectively provided on upper and lower portions of the active region in the Z direction as a margin.

The cover region may have the same material and configuration as the dielectric layer 111 except that the cover region does not include an internal electrode.

The cover region may be formed by stacking a single dielectric layer or two or more dielectric layers on the upper and lower surfaces of the active region in the Z direction, respectively, and basically, may basically serve to prevent damage to the first and second internal electrodes 121 and 122 due to physical or chemical stress.

The capacitor body 110 is not particularly limited in shape, but may have a hexahedral shape, and may include first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4 and opposing each other in the Y direction.

The dielectric layer 111 may include ceramic powder, for example, $BaTiO_3$-based ceramic powder.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$ or $Ba(Ti_{1-y}Zr_y)O_3$, in which Ca or Zr is partially solid dissolved in $BaTiO_3$, but is not limited thereto.

Along with the ceramic powder, a ceramic additive, an organic solvent, a plasticizer, a binder and a dispersant may be further added to the dielectric layer 111.

The ceramic additive may include, for example, transition metal oxide or transition metal carbide, rare earth element, magnesium (Mg) or aluminum (Al).

The first and second internal electrodes 121 and 122 are electrodes to which voltages having different polarities are applied, and may be formed on the dielectric layer 111 to be stacked in the Z direction, and may be alternately disposed to face each other with one dielectric layer 111 interposed therebetween within the capacitor body 110 in the Z direction.

The first and second internal electrodes 121 and 122 may be electrically insulated from each other by the dielectric layer 111 disposed therebetween.

One ends of the first and second internal electrodes 121 and 122 may be exposed through the third and fourth surfaces 3 and 4 of the capacitor body 110, respectively.

End portions of the first and second internal electrodes 121 and 122 alternately exposed through the third and fourth surfaces 3 and 4 of the capacitor body 110 may be electrically connected to the first and second external electrodes 131 and 132 disposed on both ends of the capacitor body 110 in the X direction, to be described later.

In this configuration, when a predetermined voltage is applied to the first and second external electrodes 131 and 132, charges are accumulated between the first and second internal electrodes 121 and 122.

In this case, the capacitance of the multilayer capacitor 100 is proportional to the overlapped areas of the first and second internal electrodes 121 and 122 overlapping each other in the Z direction in the active region.

The material for forming the first and second internal electrodes 121 and 122 is not particularly limited. For example, the first and second internal electrodes 121 and 122 may be formed using a precious metal material such as platinum (Pt), palladium (Pd), and a palladium-silver (Pd—Ag) alloy and a conductive paste formed of at least one of nickel (Ni) and copper (Cu).

As the printing method of the conductive paste, a screen printing method or a gravure printing method may be used, but an embodiment thereof is not limited thereto.

The first and second external electrodes 131 and 132 are provided with voltages having different polarities, are disposed on both ends of the capacitor body 110 in the X direction, and may be electrically connected to exposed one ends of the first and second internal electrodes 121 and 122, respectively.

The first external electrode 131 may include a first connection portion 131a and a first band portion 131b.

The first connection portion 131a is disposed on the third surface 3 of the capacitor body 110, and contacts one end of the first internal electrode 121 exposed to the outside thereof through the third surface 3 of the capacitor body 110 to serve to electrically connect the first internal electrode 121 and the first external electrode 131.

The first band portion 131b is a portion extending from the first connection portion 131a to a portion of the first surface 1 of the capacitor body 110 to be connected to a first external terminal of an interposer described later.

In this case, the first band portion 131b may further extend from the first connection portion 131a to portions of the second, fifth and sixth surfaces 2, 5, 6 of the capacitor body 110 to improve fixing strength.

The second external electrode 132 may include a second connection portion 132a and a second band portion 132b.

The second connection portion 132a is disposed on the fourth surface 4 of the capacitor body 110 and contacts one end of the second internal electrode 122 exposed to the outside thereof through the fourth surface 4 of the capacitor body 110 to serve to electrically connect the second internal electrode 122 and the second external electrode 132 to each other.

The second band portion 132b extends from the second connection portion 132a to a portion of the first surface 1 of the capacitor body 110 to be connected to a second external terminal of the interposer, which will be described later.

In this case, the second band portion 132b may further extend from the second connection portion 132a to portions of the second, fifth and sixth surfaces 2, 5 and 6 of the capacitor body 110 to improve the fixing strength.

The first and second external electrodes 131 and 132 may further include one or more plating layers 131-1 and 131-2.

The plating layers may include first and second nickel (Ni) plating layers 131-1 disposed on surfaces of the first and second external electrodes 131 and 132, and first and second tin (Sn) plating layers 131-2 covering the first and second nickel plating layers 131-1, respectively.

Figure 3:
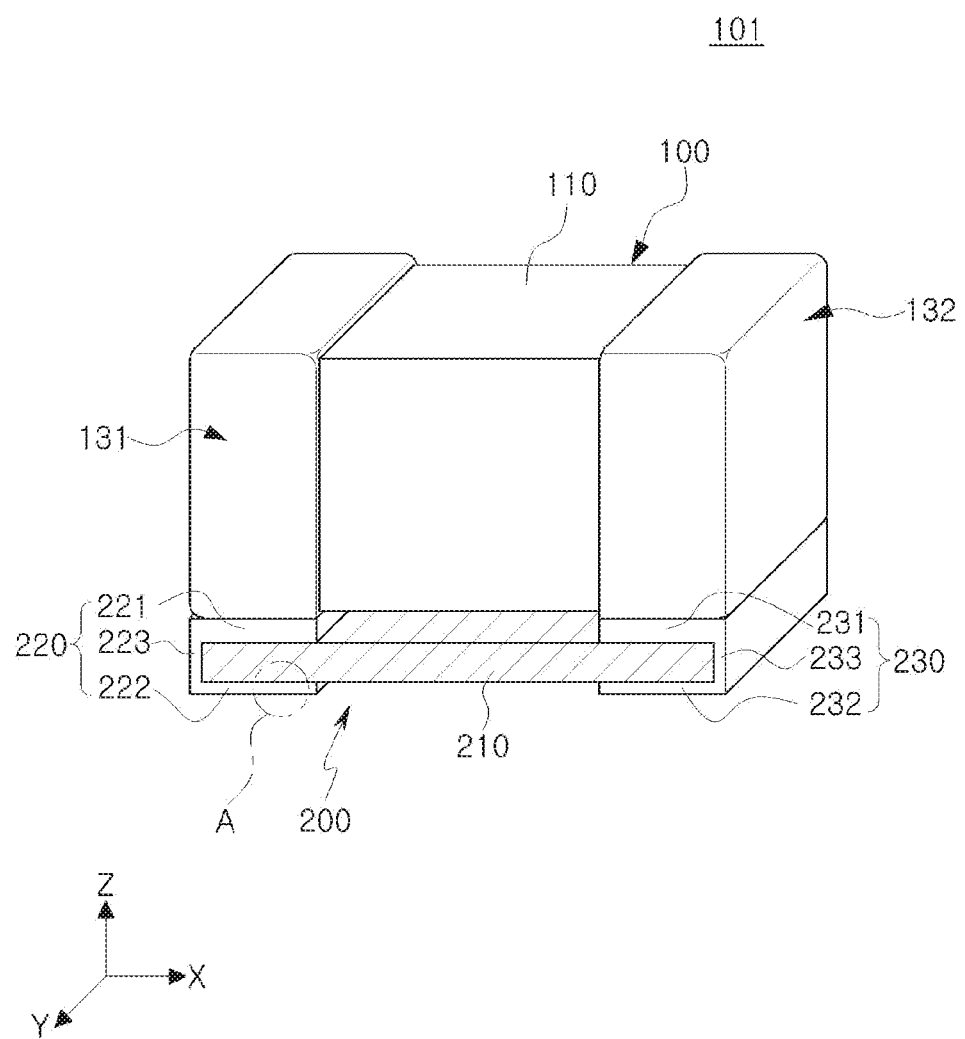
FIG. 3 is a perspective view of an electronic component according to an exemplary embodiment of the present disclosure.
Figure 4:
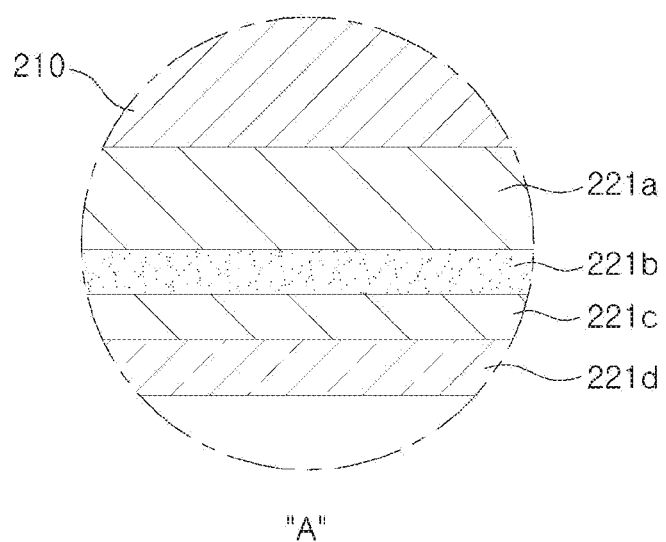
FIG. 4 is an enlarged cross-sectional view of portion A of FIG. 3.
Figure 5:
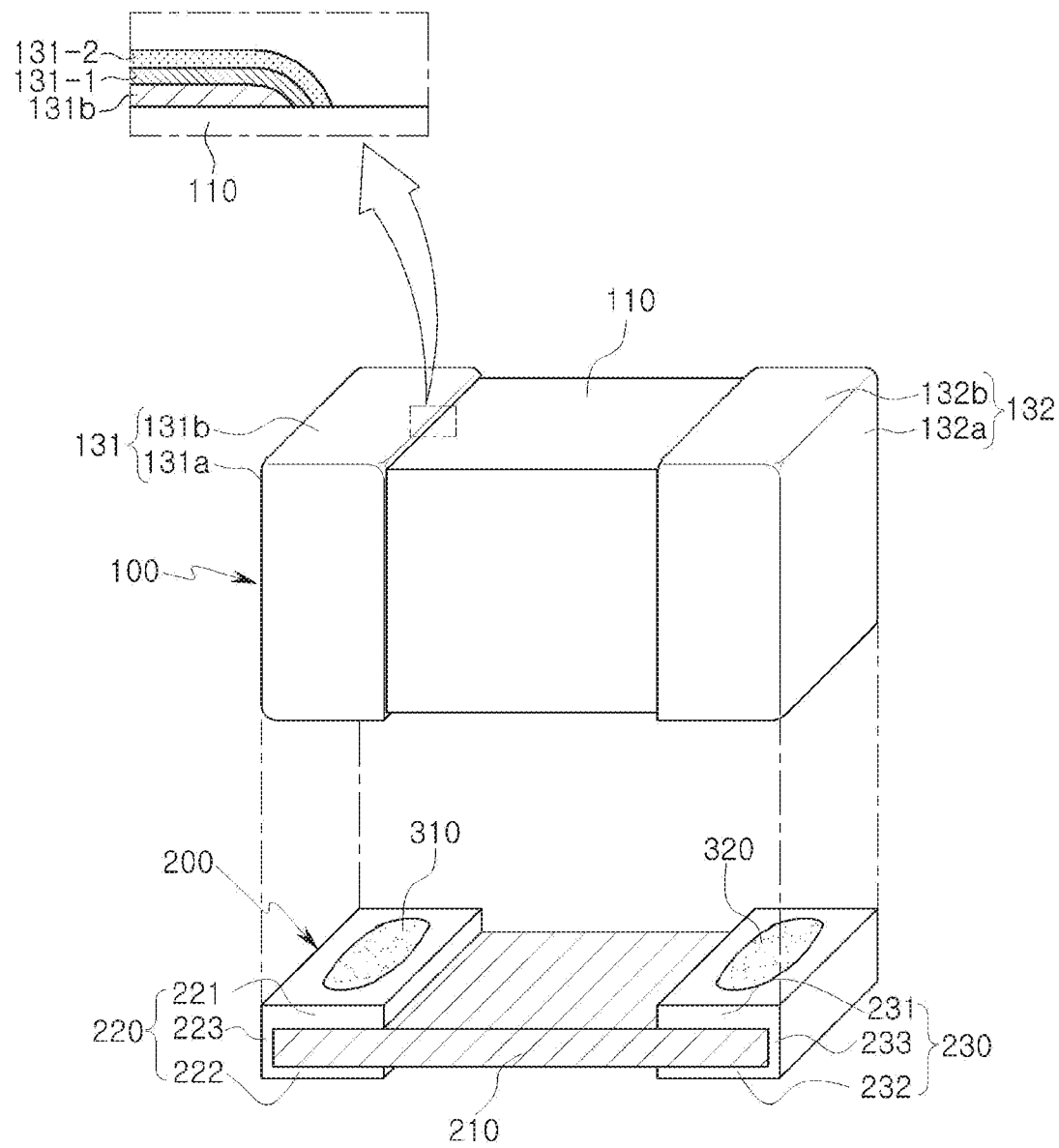
FIG. 5 is an exploded perspective view of FIG. 3.

FIG. 3 is a perspective view of an electronic component according to an exemplary embodiment of the present disclosure, FIG. 4 is an enlarged cross-sectional view of portion A of FIG. 3, and FIG. 5 is an exploded perspective view of FIG. 3.

Referring to FIGS. 3 to 5, an electronic component 101 according to this embodiment includes a multilayer capacitor 100 and an interposer 200 disposed on the first surface 1 side of the multilayer capacitor 100.

The interposer 200 includes an interposer body 210 and first and second external terminals 220 and 230 formed one both ends of the interposer body 210 in the X direction, respectively.

The interposer body 210 may be formed of a ceramic material, and in detail, may be formed of alumina ($Al_2O_3$).

The first and second external terminals 220 and 230 are provided with voltages having different polarities, and are electrically connected to the first and second band portions 131b and 132b of the first and second external electrodes 131 and 132, respectively.

The first and second external terminals 220 and 230 are formed of quadruple layers, and in more detail, include a first layer stacked from an inner side thereof, and second to fourth layers sequentially plated to cover the first layer.

FIG. 4 illustrates an enlarged portion of region A, illustrating a portion of the first external terminal 220. In this case, since there is only a difference in that the first external terminal 220 is electrically connected to the first external electrode 131 and the second external terminal 230 is connected to the second external electrode 132, the configurations of the first external terminal 220 and the second external terminal 230 are similar, and thus, the following description will be made based on the first external terminal 220, which will be described as including a description of the second external terminal 230.

The first layer 221a is a portion formed by applying a conductive paste including CuNi to the interposer body 210 and may serve to reduce vibrations transmitted from the multilayer capacitor 100.

The second layer 221b is a plating layer covering the first layer 221a, and includes Cu to serve to increase the bonding strength between the first layer 221a and the third and fourth layers 221c and 221d when performing mounting on a substrate, thereby improving bending strength.

The third layer 221c is a plating layer covering the second layer 221b and includes nickel (Ni).

The fourth layer 221d includes tin (Sn) as the plating layer covering the third layer 221c.

The third and fourth layers 221c and 221d may serve to improve electrical connectivity with a land pattern (not illustrated) of the substrate when performing mounting on the substrate.

The first external terminal 220 includes a first bonding portion 221, a first mounting portion 222, and a first connection portion 223.

The first bonding portion 221 is a portion formed on the upper surface of the interposer body 210, has one end exposed through one surface of the interposer body 210 in the X direction, and is connected to the first band portion 131b of the first external electrode 131.

The first mounting portion 222 is a portion disposed on the lower surface of the interposer body 210 to face the first bonding portion 221 in the Z direction, and may serve as a terminal when performing mounting on the substrate.

The first connection portion 223 is formed on one end surface of the interposer body 210 in the X direction and serves to connect the end of the first bonding portion 221 and the end of the first mounting portion 222.

Accordingly, the first external terminal 220 may be formed to have a [-shaped X-Z cross section.

A first conductive bonding agent 310 may be disposed between the first bonding portion 221 and the first band portion 131b to mechanically and electrically bond the first bonding portion 221 and the first band portion 131b to each other.

The first conductive adhesive 310 may be formed of a high melting point solder or the like.

The high melting point solder may include, for example, at least one or more of antimony (Sb), cadmium (Cd), lead (Pb), zinc (Zn), aluminum (Al), tin (Tin), and copper (Cu).

The second external terminal 230 includes a second bonding portion 231, a second mounting portion 232, and a second connection portion 233.

The second bonding portion 231 is a portion formed on the upper surface of the interposer body 210, has one end exposed through the other surface of the interposer body 210 in the X direction, and is connected to the second band portion 132b of the second external electrode 132.

The second mounting portion 232 is a portion disposed on the lower surface of the interposer body 210 to face the second bonding portion 231 in the Z direction and may serve as a terminal when performing mounting on the substrate.

The second connection portion 233 is formed on the other end surface of the interposer body 210 in the X direction and serves to connect the end of the second bonding portion 231 and the end of the second mounting portion 232.

Accordingly, the second external terminal 230 may be formed to have a ]-shaped X-Z cross section.

A second conductive bonding agent 320 is disposed between the second bonding portion 231 and the second band portion 132b to mechanically and electrically bond the second bonding portion 231 and the second mounting portion 232 to each other.

The second conductive adhesive 320 may be formed of a high melting point solder or the like.

For example, when voltages having different polarities are applied to the first and second external electrodes 131 and 132 while the multilayer capacitor is mounted on the substrate, the capacitor body 110 may expand and contract in the Z direction by an inverse piezoelectric effect of the dielectric layer 111.

Accordingly, both ends of the first and second external electrodes 131 and 132 contract and expand in the opposite direction to expansion and contraction of the capacitor body 110 in the Z direction by the Poisson effect, thereby causing vibrations.

The vibration is transmitted to the substrate by the first and second external electrodes 131 and 132, and thus, sound is radiated from the substrate to become acoustic noise.

The interposer 200 according to this embodiment is attached to the first surface 1 side of the multilayer capacitor 100 in the mounting direction to absorb vibrations of the multilayer capacitor 100 and to reduce transmission of the vibrations to the substrate, thereby reducing acoustic noise.

Figure 6:
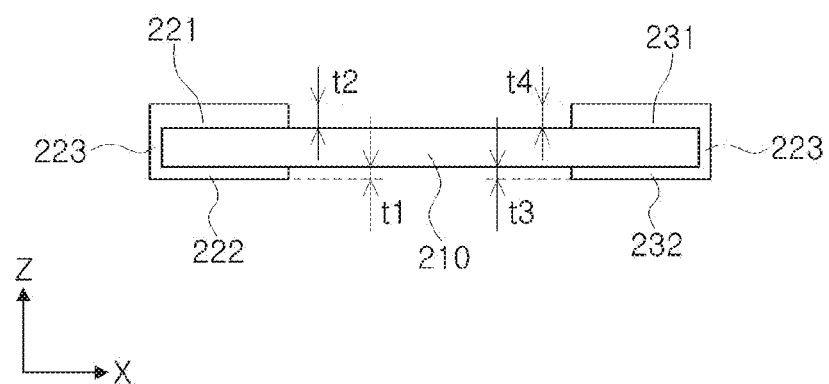
FIG. 6 is a front view of an interposer of FIG. 3.

Referring to FIG. 6, a thickness t2 of the first bonding portion 221 may be greater than a thickness t1 of the first mounting portion 222 in the Z direction, and a thickness t4 of the second bonding portion 231 may be greater than a thickness t3 of the second mounting portion 232 in the Z direction.

In this case, a case in which t1 and t3 are the same thicknesses, and t2 and t4 are the same thicknesses may be provided by way of example.

In the state in which the total thickness of the interposer is determined, when the thickness of the bonding portion is relatively greater than the thickness of the mounting portion, a gap between the multilayer capacitor and the interposer increases, so that the effect of reducing acoustic noise may be further improved.

In addition, when the thickness of the bonding portion is greater than the thickness of the mounting portion, a horn shape may be prevented from being formed in the first and second mounting portions 222 and 232 bonded to the land pattern (not illustrated) when performing mounting on the substrate, thereby reducing a step of the mounting portion.

In this case, the step means the height difference between the center portion and the end portion of the first mounting portion 222 or a height difference between the center portion and the end portion of the second mounting portion 232.

In the case of the interposer, the thicker the thickness of the external terminal is, the more acoustic noise is reduced. However, since the thickness of the external terminal that may be implemented by printing is limited, the number of times of printing the electrode is increased to increase the thickness of the external terminal.

In this case, in the case of the external terminal printed twice, the Sn flows toward the bottom surface, and agglomeration of Sn occurs, and a horn shape is generated on the surface of the mounting portion, thereby causing a step difference defect in the mounting portion.

In the case of the external terminal printed once, even in the case in which Sn is melted, no agglomeration of Sn occurs, so that a defect such as a step difference of the mounting portion does not occur.

In this embodiment, in the first and second external terminals 220 and 230, the first and second bonding portions 221 and 231 are formed relatively thicker than the first and second mounting portions 222 and 232. In this case, the first layer 221a is formed by once printing, and the remaining second to fourth layers 221b, 221c and 221d are formed by plating, thereby preventing agglomeration of Sn in the mounting portion while reducing acoustic noise.

Accordingly, by preventing the formation of the horn shape on the surfaces of the first and second mounting portions 222 and 232, the surface level of the first and second mounting portions 222 and 232 may be significantly reduced to form the flat surface. Thus, the stability of the electronic component 101 may be improved in mounting the electronic component 101 on the substrate.

In this case, the thickness of the first bonding portion 221 may be formed to be 20 to 40 μm greater than the thickness of the first mounting portion 222, and the thickness of the second bonding portion 231 may be formed to be 20 to 40 μm greater than the thickness of the second mounting portion 232.

If the value obtained by subtracting the thickness of the first mounting portion 222 based on the thickness of the first bonding portion 221 is less than 20 μm, agglomeration of Sn may occur, and if the absolute value of the value obtained by subtracting the thickness of the first bonding portion 221 based on the thickness of the first mounting portion 222 is less than 40 μm, the acoustic noise reduction effect may be reduced.

If the value obtained by subtracting the thickness of the second mounting portion 232 based on the thickness of the second bonding portion 231 is less than 20 μm, agglomeration of Sn may occur, and if the absolute value of the value obtained by subtracting the thickness of the second bonding portion 231 based on the thickness of the second mounting portion 232 is less than 40 μm, the acoustic noise reduction effect may be reduced.

In addition, in more detail, the thickness of the first bonding portion 221 may be formed to be 20 to 30 μm greater than the thickness of the first mounting portion 222, and the thickness of the second bonding portion 231 may be 20 to 30 μm greater than the thickness than that of the second mounting portion 232.

Experimental Example

Multilayer capacitors of 2.0×1.2 mm size, 22 uF, and 25V class were manufactured in various designs as illustrated in Table 1 below, and electronic components were manufactured by bonding 1.7×1.2×0.53 mm size ceramic interposers with high melting point solder.

In the present experimental example, the first and second mounting portions of the interposer were formed targeting that the first layer has a thickness of 10 μm and the total thickness of the second to fourth layers is 25 μm, respectively, and the first and second bonding portions thereof were formed targeting that the thickness of the first layer is 30 μm and the total thickness of the second to fourth layers is 25 μm, respectively, thereby manufacturing the electronic components.

In this case, the thickness of the second mounting portion was the same as the thickness of the first mounting portion, and the thickness of the second bonding portion was the same as the thickness of the first bonding portion.

Table 1 below shows measured acoustic noise of each electronic component and provides whether Sn agglomeration occurs in the first and second mounting portions of the first and second external terminals of the interposer.

TABLE 1

| # | Thickness of Mounting Portion (A) (μm) | Thickness of Bonding Portion (B) (μm) | B − A (μm) | Sn Aggregation Occurrence or Not | Acoustic Noise (dB) |
|---|---|---|---|---|---|
| 1 | 39 | 61 | 22 | X | 33.5 |
| 2 | 38 | 72 | 34 | X | 33.1 |
| 3 | 41 | 63 | 22 | X | 33.8 |
| 4 | 62 | 66 | 4 | ○ | 33.3 |
| 5 | 63 | 68 | 5 | ○ | 34.1 |
| 6 | 41 | 37 | −4 | X | 37.1 |
| 7 | 38 | 50 | 12 | X | 35.9 |
| 8 | 37 | 65 | 28 | X | 34.8 |
| 9 | 40 | 83 | 43 | X | 33.7 |
| 10 | 43 | 91 | 48 | X | 33.2 |
| 11 | 42 | 111 | 69 | X | 32.8 |
| 12 | 39 | 126 | 87 | X | 32.9 |

Referring to Table 1, #1-3 indicates the result of measuring the Sn agglomeration of three representative samples and acoustic noise.

In the case of #1-3, acoustic noise was measured as 35 dB or lower as a good state, and no Sn agglomeration occurred. At this time, B-A satisfied the numerical range of 20 to 40 μm.

In #4-5 to evaluate the numerical limits of the first and second mounting portions, the thickness of the first and second mounting portions increased through two prints, and then Sn agglomeration and acoustic noise were measured.

In the case of #4-5, acoustic noise was measured as a good state, but Sn agglomeration occurred. At this time, B-A was confirmed to be less than 10 μm.

6-12 shows the results of measuring Sn agglomeration and acoustic noise after gradually increasing the thickness of the first and second bonding portions to evaluate the numerical limits of the first and second bonding portions.

In the case of #6-12, Sn agglomeration did not occur in the case of #6-7 in which the thickness of the first and second bonding portions was less than 65 μm, but acoustic noise exceeded 35 dB.

In addition, in the case of #11-12 in which the thickness of the first and second bonding portions is 111 μm or more, it can be seen that Sn agglomeration does not occur, but acoustic noise is no longer reduced critically.

As set forth above, according to an exemplary embodiment of the present disclosure, by including an interposer comprised of a quadruple layer structure in which an external terminal includes an inner first layer including CuNi and an outer second layer including Cu, the bonding force between the external electrode of the multilayer capacitor and the external terminal of the interposer may be increased, and the acoustic noise may be reduced while improving the bending strength of the electronic component.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component comprising:
a multilayer capacitor including a capacitor body having first and second surfaces opposing each other in a first direction, third and fourth surfaces connected to the first and second surfaces and opposing each other in a second direction, and fifth and sixth surfaces connected to the first and second surfaces, connected to the third and fourth surfaces and opposing each other, the multilayer capacitor further including first and second external electrodes disposed on both ends of the capacitor body, respectively, in the second direction; and
an interposer disposed on a first surface side of the multilayer capacitor in the first direction, the interposer including an interposer body and first and second external terminals disposed on both ends of the interposer body in the second direction,
wherein the capacitor body includes a plurality of dielectric layers and a plurality of first and second internal electrodes alternately disposed in the first direction, with the respective dielectric layers interposed therebetween,
the plurality of first and second internal electrodes are exposed through the third and fourth surfaces of the capacitor body, respectively,
the first and second external terminals each include a first layer including CuNi, a second layer covering the first layer and including copper (Cu), a third layer covering the second layer and including nickel (Ni), and a fourth layer covering the third layer and including tin (Sn), which are sequentially disposed from a respective inner side of the first and second external terminals, and
the second layer is arranged between the capacitor body and interposer body in the first direction.

2. The electronic component of claim 1, wherein the second to fourth layers are plating layers.

3. The electronic component of claim 1, wherein the first external terminal comprises a first bonding portion disposed on the interposer body to be connected to the first external electrode, a first mounting portion disposed on the interposer body to face the first bonding portion in the first direction, and a first connection portion disposed on the interposer body to connect the first bonding portion and the first mounting portion, and
the second external terminal comprises a second bonding portion disposed on the interposer body to be connected to the second external electrode, a second mounting portion disposed on the interposer body to face the second bonding portion in the first direction, and a second connection portion disposed on the interposer body to connect the second bonding portion and the second mounting portion.

4. The electronic component of claim 3, wherein conductive adhesives are arranged between the first and second external electrodes and the first and second bonding portions, respectively.

5. The electronic component of claim 4, wherein the conductive adhesives include solder.

6. The electronic component of claim 3, wherein the first and second external terminals each have a 'U'-shaped cross section.

7. The electronic component of claim 3, wherein a thickness of the first bonding portion is greater than a thickness of the first mounting portion in the first direction, and a thickness of the second bonding portion is greater than a thickness of the second mounting portion in the first direction.

8. The electronic component of claim 7, wherein the thickness of the first bonding portion is 20 to 40 µm greater than the thickness of the first mounting portion, and the thickness of the second bonding portion is 20 to 40 µm greater than the thickness of the second mounting portion.

9. The electronic component of claim 3, wherein thicknesses of the first and second bonding portions in the first direction are 65 µm or more and less than 111 µm.

10. The electronic component of claim 1, wherein the interposer body includes alumina.

11. The electronic component of claim 1, wherein the first and second external electrodes comprise first and second connection portions disposed on the third and fourth surfaces of the capacitor body, respectively, and first and second band portions extending from the first and second connection portions, respectively, to portions of the first surface of the capacitor body.

12. The electronic component of claim 11, wherein the first and second band portions further extend from the first and second connection portions, respectively, to portions of the second, fifth, and sixth surfaces of the capacitor body.

13. The electronic component of claim 1, further comprising a plating layer disposed on surfaces of the first and second external electrodes.

14. An electronic component comprising:

a multilayer capacitor including a capacitor body having first and second surfaces opposing each other in a first direction, third and fourth surfaces connected to the first and second surfaces and opposing each other in a second direction, and fifth and sixth surfaces connected to the first and second surfaces, connected to the third and fourth surfaces and opposing each other, the multilayer capacitor further including first and second external electrodes disposed on both ends of the capacitor body, respectively, in the second direction; and an interposer disposed on a first surface side of the multilayer capacitor in the first direction, the interposer including an interposer body and first and second external terminals disposed on both ends of the interposer body in the second direction, wherein the capacitor body includes a plurality of dielectric layers and a plurality of first and second internal electrodes alternately disposed in the first direction, with the respective dielectric layers interposed therebetween, the plurality of first and second internal electrodes are exposed through the third and fourth surfaces of the capacitor body, respectively, the first and second external terminals each include four distinctive layers including a first layer, a second layer covering the first layer, a third layer covering the second layer, and a fourth layer covering the third layer, which are sequentially disposed from a respective inner side of the first and second external terminals, the first to fourth layers of each of the first and second external terminals include materials different from each other, and the second layer is arranged between the capacitor body and interposer body in the first direction.

15. The electronic component of claim 14, wherein the first external terminal comprises a first bonding portion disposed on the interposer body to be connected to the first external electrode, a first mounting portion disposed on the interposer body to face the first bonding portion in the first direction, and a first connection portion disposed on the interposer body to connect the first bonding portion and the first mounting portion, and the second external terminal comprises a second bonding portion disposed on the interposer body to be connected to the second external electrode, a second mounting portion disposed on the interposer body to face the second bonding portion in the first direction, and a second connection portion disposed on the interposer body to connect the second bonding portion and the second mounting portion.

16. The electronic component of claim 15, wherein the first and second external terminals each have a 'U'-shaped cross section.

17. The electronic component of claim 16, wherein a thickness of the first bonding portion is greater than a thickness of the first mounting portion in the first direction, and a thickness of the second bonding portion is greater than a thickness of the second mounting portion in the first direction.

18. The electronic component of claim 17, wherein the thickness of the first bonding portion is 20 to 40 µm greater than the thickness of the first mounting portion, and the thickness of the second bonding portion is 20 to 40 µm greater than the thickness of the second mounting portion.

19. The electronic component of claim 15, wherein thicknesses of the first and second bonding portions in the first direction are 65 µm or more and less than 111 µm.

* * * * *